US012733344B2

(12) United States Patent
You

(10) Patent No.: US 12,733,344 B2
(45) Date of Patent: Sep. 8, 2026

(54) DISPLAY DEVICE WITH CAPACITOR HAVING ELECTRODE FORMED OF TRANSPARENT SEMICONDUCTOR MATERIAL

(71) Applicant: LG Display Co., Ltd., Seoul (KR)

(72) Inventor: JaeYong You, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 382 days.

(21) Appl. No.: 18/463,104

(22) Filed: Sep. 7, 2023

(65) Prior Publication Data

US 2024/0090269 A1 Mar. 14, 2024

(30) Foreign Application Priority Data

Sep. 13, 2022 (KR) ........................ 10-2022-0114708

(51) Int. Cl.
*H10K 59/121* (2023.01)
*H10K 59/131* (2023.01)

(52) U.S. Cl.
CPC ....... *H10K 59/1216* (2023.02); *H10K 59/131* (2023.02)

(58) Field of Classification Search
CPC ......................... H10K 59/1216; H10K 59/131
See application file for complete search history.

(56) References Cited

U.S. PATENT DOCUMENTS

2015/0144910 A1 5/2015 Beak et al.
2016/0043157 A1 2/2016 Park et al.
2017/0148861 A1* 5/2017 Kim ....................... H10K 71/00
2017/0287943 A1 10/2017 Ma et al.
2019/0221165 A1* 7/2019 Park ..................... G09G 3/3258
2019/0362672 A1 11/2019 Cui et al.
2021/0104558 A1* 4/2021 Kim .................. H10D 30/6731
2021/0134899 A1* 5/2021 Peng .................... H10K 59/121

FOREIGN PATENT DOCUMENTS

KR 10-2016-0017371 A 2/2016
KR 10-2018-0129800 A 12/2018
KR 10-2086496 B1 3/2020

* cited by examiner

*Primary Examiner* — Lex H Malsawma
(74) *Attorney, Agent, or Firm* — Seed Intellectual Property Law Group LLP

(57) ABSTRACT

A display device including a capacitor disposed in a subpixel in the area overlapping an optical element positioned on the rear surface of a substrate of a display panel is disposed using a semiconductor material, the transparency of the area may be enhanced, and the performance of the optical function performed by the optical element forward of the surface where the display panel displays images from the rear surface of the display panel may be enhanced.

22 Claims, 9 Drawing Sheets

DISPLAY DEVICE WITH CAPACITOR HAVING ELECTRODE FORMED OF TRANSPARENT SEMICONDUCTOR MATERIAL

CROSS-REFERENCE TO RELATED APPLICATION

This application claims priority from Korean Patent Application No. 10-2022-0114708, filed on Sep. 13, 2022, which is hereby incorporated by reference for all purposes as if fully set forth herein.

BACKGROUND

Technical Field

Embodiments of the disclosure relate to display devices.

Description of the Related Art

A display device may include a display panel with multiple subpixels and various driving circuits for driving the subpixels. The display device may display an image while adjusting the brightness represented through a plurality of subpixels.

The display device may include an optical device, such as a camera sensor or an infrared light source, to provide more diverse functions. The optical device may be disposed in different locations in the display, for example, a bezel area where no image is displayed on the display panel or in the active area where images are displayed.

Because the optical device is disposed in the display device, the bezel area of the display panel may increase or the active area may decrease.

BRIEF SUMMARY

Embodiments of the disclosure provide a method for disposing an optical element on a display panel without increasing the bezel area or reducing the active area of the display panel while also enhancing performance according to driving of the optical element disposed on the display panel.

Embodiments of the disclosure may provide a display device comprising a substrate including a first area where a plurality of first subpixels are positioned and a second area where a plurality of second subpixels are positioned, a first storage capacitor disposed in each of the plurality of first subpixels and including a first upper capacitor electrode and a first lower capacitor electrode, and a second storage capacitor disposed in each of the plurality of second subpixels and including a second upper capacitor electrode and a second lower capacitor electrode, wherein at least one of the second upper capacitor electrode or the second lower capacitor electrode has a greater transparency than the first upper capacitor electrode and the first lower capacitor electrode.

The display device may comprise at least one optical element positioned on the rear surface of the substrate and overlapping at least a portion of the second area.

Embodiments of the disclosure may provide a display device comprising a substrate including a first area where a plurality of first subpixels are positioned and a second area where a plurality of second subpixels are positioned and a storage capacitor disposed in at least one of the plurality of first subpixels or the plurality of second subpixels and including a lower capacitor electrode formed of a first semiconductor material and an upper capacitor electrode formed of a second semiconductor material different from the first semiconductor material.

According to embodiments of the disclosure, it is possible to dispose the optical element without increasing the bezel area or decreasing the active area of the display panel and enhance performance according to driving of the optical element disposed to overlap the display panel.

According to one embodiment, a display device is provided with a substrate including a first area having a plurality of first subpixels and a second area having a plurality of second subpixels. A light emitting diode is within each of the respective first and second pixels and each of the light emitting diode has an anode and a cathode. A drive transistor is within each of the respective first and second pixels, each of the drive transistors having a gate electrode, first terminal electrically coupled to power supply source and a second terminal electrically coupled to at least one the anode or the cathode of the light emitting diode. A first capacitor within each of respective first pixels has a first electrode and a second electrode; and a second capacitor within each of respective second pixels has a first electrode and a second. The first electrode of the first capacitor is directly connected to the gate electrode of the drive transistor in each respective first pixel and the first electrode of the second capacitor is directly connected to the gate electrode of the drive transistor in each respective second pixel. The transparency of the second capacitor is greater than a transparency of the first capacitor.

DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
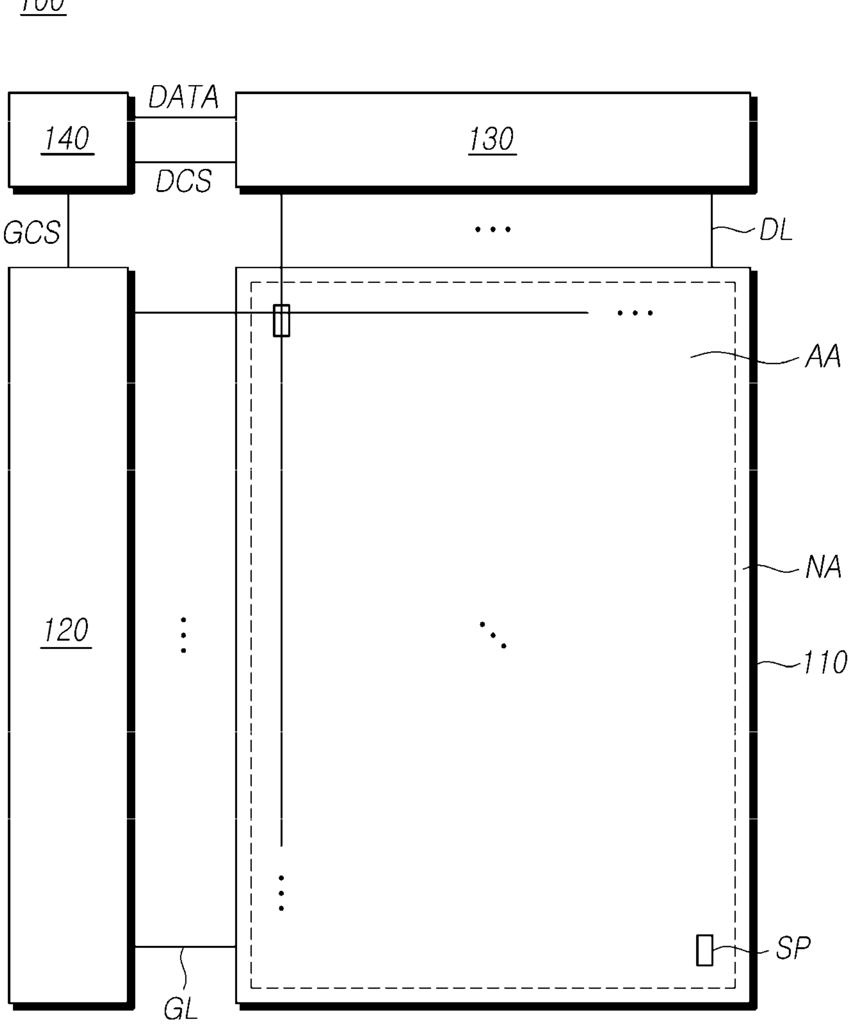
FIG. 1 is a view schematically illustrating a configuration of a display device according to embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, area occupied and thickness of the components illustrated in various drawings submitted herewith are according to scale and form part of the present disclosure.

Hereinafter, various embodiments of the present disclosure will be described in detail with reference to accompanying drawings.

FIG. 1 is a view schematically illustrating a configuration of a display device 100 according to embodiments of the disclosure.

Referring to FIG. 1, a display device 100 may include a display panel 110 and a gate driving circuit 120, a data driving circuit 130, and a controller 140 for driving the display panel 110.

The display panel 110 may include an active area AA in which a plurality of subpixels SP are disposed and a non-active area NA positioned outside the active area AA.

The display panel 110 may include a plurality of gate lines GL, a plurality of data lines DL, and subpixels SP at the crossings of the gate lines GL and the data lines DL.

The gate driving circuit 120 may be controlled by the controller 140 to sequentially output scan signals to the plurality of gate lines GL disposed in the display panel 110, controlling the driving timing of the subpixels SP.

The gate driving circuit 120 may include one or more gate driver integrated circuits (GDICs). Depending on driving schemes, the gate driving circuit 120 may be positioned on only one side, or each of two opposite sides, of the display panel 110.

Each gate driver integrated circuit (GDIC) may be connected to a bonding pad of the display panel 110 using a tape automated bonding (TAB) method or a chip on glass (COG) method. Alternatively, each gate driver integrated circuit (GDIC) may be implemented in a gate in panel (GIP) type and be disposed directly on the display panel 110. Alternatively, each gate driver integrated circuit (GDIC) may be integrated and disposed on the display panel 110. Each gate driver integrated circuit (GDIC) may also be implemented in a chip-on-film (COF) scheme to be mounted on a film connected to the display panel 110.

The data driving circuit 130 receives image data DATA from the controller 140 and convert the image data DATA into an analog data voltage Vdata. The data driving circuit 130 outputs the data voltage Vdata to each data line DL according to the timing of applying a scan signal via the gate line GL, allowing each subpixel SP to represent a brightness according to the image data DATA.

The data driving circuit 130 may include one or more source driver integrated circuits (SDICs).

Each source driver integrated circuit (SDIC) may include, e.g., shift registers, latch circuits, digital-analog converters, and output buffers.

Each source driver integrated circuit (SDIC) may be connected to a bonding pad of the display panel 110 using a tape automated bonding (TAB) method or a chip on glass (COG) method. Alternatively, each source driver integrated circuit (SDIC) may be directly disposed on the display panel 110. Alternatively, each source driver integrated circuit (SDIC) may be integrated and disposed on the display panel 110. Alternatively, each source driver integrated circuit (SDIC) may be implemented by a chip on film (COF) method. In this case, each source driver integrated circuit (SDIC) may be mounted on a film connected to the display panel 110 and may be electrically connected to the display panel 110 through lines on the film.

The controller 140 may supply various control signals to the gate driving circuit 120 and the data driving circuit 130 and control the operation of the gate driving circuit 120 and the data driving circuit 130.

The controller 140 may be mounted on a printed circuit board or a flexible printed circuit and may be electrically connected with the gate driving circuit 120 and the data driving circuit 130 through the printed circuit board or the flexible printed circuit.

The controller 140 may enable the gate driving circuit 120 to output scan signals according to the timing set in each frame, convert image data received from the outside to meet the data signal format used by the data driving circuit 130, and output the resultant image data to the data driving circuit 130.

The controller 140 receives, from the outside (e.g., a host system), various timing signals including a vertical synchronization signal (VSYNC), a horizontal synchronization signal (HSYNC), an input data enable signal (DE), and a clock signal, along with the image data.

The controller 140 may generate a diversity of control signals using the timing signals received from the outside and output the control signals to the gate driving circuit 120 and the data driving circuit 130.

As an example, to control the gate driving circuit 120, the controller 140 outputs various gate control signals GCS including a gate start pulse (GSP), a gate shift clock (GSC), and a gate output enable signal (GOE).

The gate start pulse (GSP) controls the operation start timing of one or more gate driver integrated circuits (GDICs) constituting the gate driving circuit 120. The gate shift clock (GSC) is a clock signal commonly input to one or more gate driver integrated circuits (GDICs) and controls the shift timing of the scan signals. The gate output enable signal (GOE) designates timing information about one or more gate driver integrated circuits (GDICs).

To control the data driving circuit 130, the controller 140 outputs various data control signals DCS including, e.g., a source start pulse (SSP), a source sampling clock (SSC), and a source output enable signal (SOE).

The source start pulse (SSP) controls the data sampling start timing of one or more source driver integrated circuits (SDICs) constituting the data driving circuit 130. The source sampling clock (SSC) is a clock signal for controlling the sampling timing of data in each source driver integrated circuit (SDIC). The source output enable signal (SOE) controls the output timing of the data driving circuit 130.

The display device 100 may further include a power management integrated circuit that supplies various voltages or currents to various circuits, e.g., the display panel 110, the gate driving circuit 120, and the data driving circuit 130 or controls various voltages or currents to be supplied. The display device 100 may be use to provide a display output for a variety of electronic devices, for example, a smart phone, a smart watch, a notebook computer, a notepad, an automobile display, automobile dashboard or otherwise device.

Each subpixel SP may be an area generally located at the overlap of the gate line GL and the data line DL, and at least one circuit element including a light emitting element may be disposed therein.

For example, if the display device 100 is an organic light emitting display device, organic light emitting diodes (OLEDs) and several circuit elements may be disposed in the plurality of subpixels SP. Each subpixel SP may display a brightness corresponding to image data by controlling the current supplied to the OLED by several circuit elements.

In some cases, a light emitting diode (LED) or micro light emitting diode (LED) may be disposed in each subpixel SP.

Figure 2:
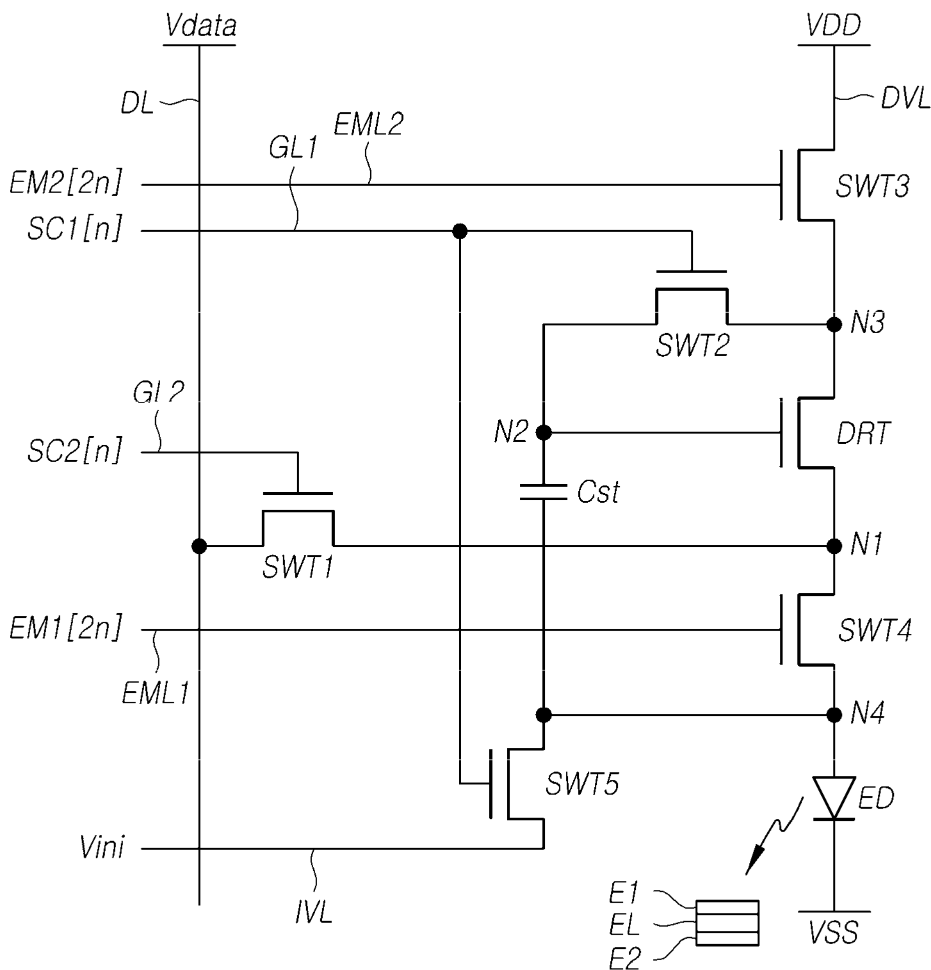
FIG. 2 is a view illustrating an example circuit structure of a subpixel included in a display device according to embodiments of the disclosure.
Figure 3:
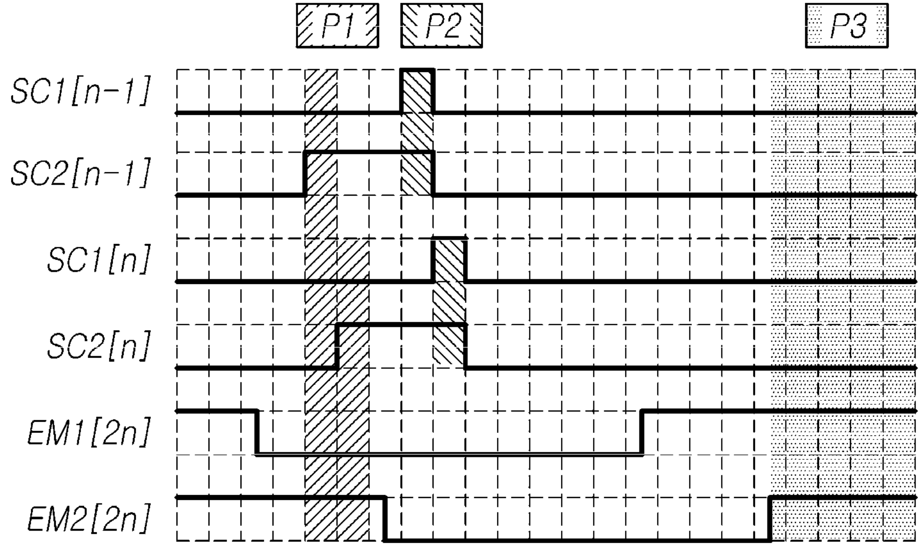
FIG. 3 is a view illustrating an example driving timing of the subpixel illustrated in FIG. 2.

FIG. 2 is a view illustrating an example circuit structure of a subpixel SP included in a display device 100 according to embodiments of the disclosure. FIG. 3 is a view illustrating an example driving timing of the subpixel SP illustrated in FIG. 2.

Referring to FIG. 2, each of a plurality of subpixels SP may include a light emitting element ED and at least one circuit element (e.g., a thin film transistor or a capacitor) for driving the light emitting element ED. For example, a driving transistor DRT for supplying a driving current to the light emitting element ED may be disposed in the subpixel SP. Two or more switching transistors SWT1, SWT2, SWT3, SWT4, and SWT5 that control the driving timing of the light emitting element ED and the driving transistor DRT may be disposed in the subpixel SP. A storage capacitor Cst for maintaining the data voltage Vdata for supplying driving current for one frame may be disposed in the subpixel SP.

Although FIG. 2 illustrates a 6T1C structure in which six thin film transistors and one capacitor are disposed in each of the plurality of subpixels SP in addition to the light emitting element ED as an example, embodiments of the disclosure are not limited thereto. Further, although in the example illustrated in FIG. 2, all of the thin film transistors disposed in the subpixel SP are of N-type, at least some of the thin film transistors disposed in the sub-pixel SP may be of P-type.

A first switching transistor SWT1 may be electrically connected between a data line DL and a first node N1. The first switching transistor SWT1 may be controlled by a second scan signal SC2 supplied via the second gate line GL2. The first switching transistor SWT1 may control application of the data voltage Vdata, which is supplied through the data line DL, to the first node N1. The data voltage Vdata applied to the first node N1 may be applied to the second node N2 through the driving transistor DRT and the second switching transistor SWT2.

The first node N1 may be, e.g., the source node or the drain node of the driving transistor DRT. The second node N2 may be, e.g., the gate node of the driving transistor DRT. The third node N3 may be, e.g., the drain node or the source node of the driving transistor DRT.

The second switching transistor SWT2 may be electrically connected between the second node N2 and the third node N3. The second switching transistor SWT2 may be controlled by the first scan signal SC1 supplied through the first gate line GL1. The second switching transistor SWT2 may control the application of the data voltage Vdata applied to the first node N1 to the second node N2 via the third node N3.

The third switching transistor SWT3 may be electrically connected between the driving voltage line DVL to which the first driving voltage VDD is supplied and the third node N3. The third switching transistor SWT3 may be controlled by the second emission control signal EM2 supplied through the second emission control line EML2. The third switching transistor SWT3 may control application of the first driving voltage VDD to the third node N3. The first driving voltage VDD may be, e.g., a high-potential driving voltage.

The fourth switching transistor SWT4 may be electrically connected between the first node N1 and the fourth node N4. The fourth switching transistor SWT4 may be controlled by the first emission control signal EM1 supplied through the first emission control line EML1. The fourth switching transistor SWT4 may control application of the driving current to the fourth node N4. The fourth node N4 may be a node electrically connected to the anode electrode of the light emitting element ED.

The fifth switching transistor SWT5 may be electrically connected between the initialization voltage line IVL and the fourth node N4. The fifth switching transistor SWT5 may be controlled by the first scan signal SC1 supplied through the first gate line GL1. The fifth switching transistor SWT5 may control application of the initialization voltage Vini to the fourth node N4.

The driving transistor DRT may be electrically connected between the third switching transistor SWT3 and the fourth switching transistor SWT4. The driving transistor DRT may supply the driving current according to the data voltage Vdata applied to the second node N2 to the light emitting element ED.

The storage capacitor Cst may be electrically connected between the second node N2 and the fourth node N4. The storage capacitor Cst may be considered to be electrically connected between the gate node and the source node of the driving transistor DRT. The storage capacitor Cst may maintain the data voltage Vdata for one frame.

The light emitting element ED may be electrically connected between the fourth node N4 and the line to which the second driving voltage VSS is supplied. The second driving voltage VSS may be, e.g., a low-potential driving voltage. The light emitting element ED may include, e.g., a first electrode layer E1, a light emitting layer EL, and a second electrode layer E2. The first electrode E1 can be an anode and the second electrode E2 can be a cathode. In some embodiments, the second electrode E2 is a common electrode to all light emitting elements ED on the chip and thus is a common cathode. The light emitting element ED may display a brightness according to the driving current supplied by the driving transistor DRT.

The circuit element disposed in the subpixel SP may be driven according to the timings of the signals supplied through the gate line GL and the emission control line EML. The light emitting element ED may emit light for a predetermined period according to driving of the circuit element disposed in the subpixel SP.

FIG. 3 exemplarily illustrates the driving timings of the subpixel SP disposed in the (n−1)th row and the subpixel SP disposed in the nth row.

For example, the second scan signal SC2 of the turn-on level may be supplied to the second gate line GL2 in the first period P1. The first switching transistor SWT1 may be turned on. The data voltage Vdata may be applied to the first node N1.

In a state in which the second scan signal SC2 maintains the turn-on level in the second period P2, the first scan signal SC1 of the turn-on level may be supplied to the first gate line GL1. The second switching transistor SWT2 and the fifth switching transistor SWT5 may be turned on.

Since the second switching transistor SWT2 is turned on, the second node N2 and the third node N3 may be electrically connected. As the second node N2 and the third node N3 of the driving transistor DRT are electrically connected, the data voltage Vdata applied to the first node N1 may be applied to the second node N2 through the driving transistor DRT and the second switching transistor SWT2.

In this process, a voltage reflecting the threshold voltage of the driving transistor DRT may be applied to the second node N2. A change in the threshold voltage of the driving transistor DRT may be compensated for, and the driving current corresponding to the data voltage Vdata may be supplied by the driving transistor DRT.

After the second period P2, the first scan signal SC1 of the turn-off level and the second scan signal SC2 of the turn-off level may be supplied.

The first emission control signal EM1 of the turn-on level and the second emission control signal EM2 of the turn-on level may be sequentially supplied.

The fourth switching transistor SWT4 may be turned on by the first emission control signal EM1 of the turn-on level supplied through the first emission control line EML1. The initialization voltage Vini may be applied to the first node N1 and the fourth node N4.

The third switching transistor SWT3 may be turned on by the second emission control signal EM2 of the turn-on level supplied through the second emission control line EML2. The first driving voltage VDD may be supplied to the third node N3.

A driving current according to a difference between the voltage applied to the second node N2 and the voltage applied to the first node N1 of the driving transistor DRT may be supplied to the light emitting element ED. During the third period P3, the light emitting element ED displays brightness according to the driving current, and an image may be displayed through the plurality of subpixels SP.

Since the light emitting element ED disposed in the subpixel SP emits light and displays an image, a specific area of the active area AA or the subpixel SP may have a predetermined transmittance depending on the structure of the subpixel SP. An optical device may be disposed in an area overlapping the active area AA on a surface opposite to the surface on which the display panel 110 displays an image, and the optical device may function as an optical device forward of the surface on which the image is displayed. The optical device may be any of a number of acceptable devices commonly used with display devices of the type described herein, including a camera, a lens, a CMOS imager, a range finder, a light source, light sensor or the like.

Figure 4:
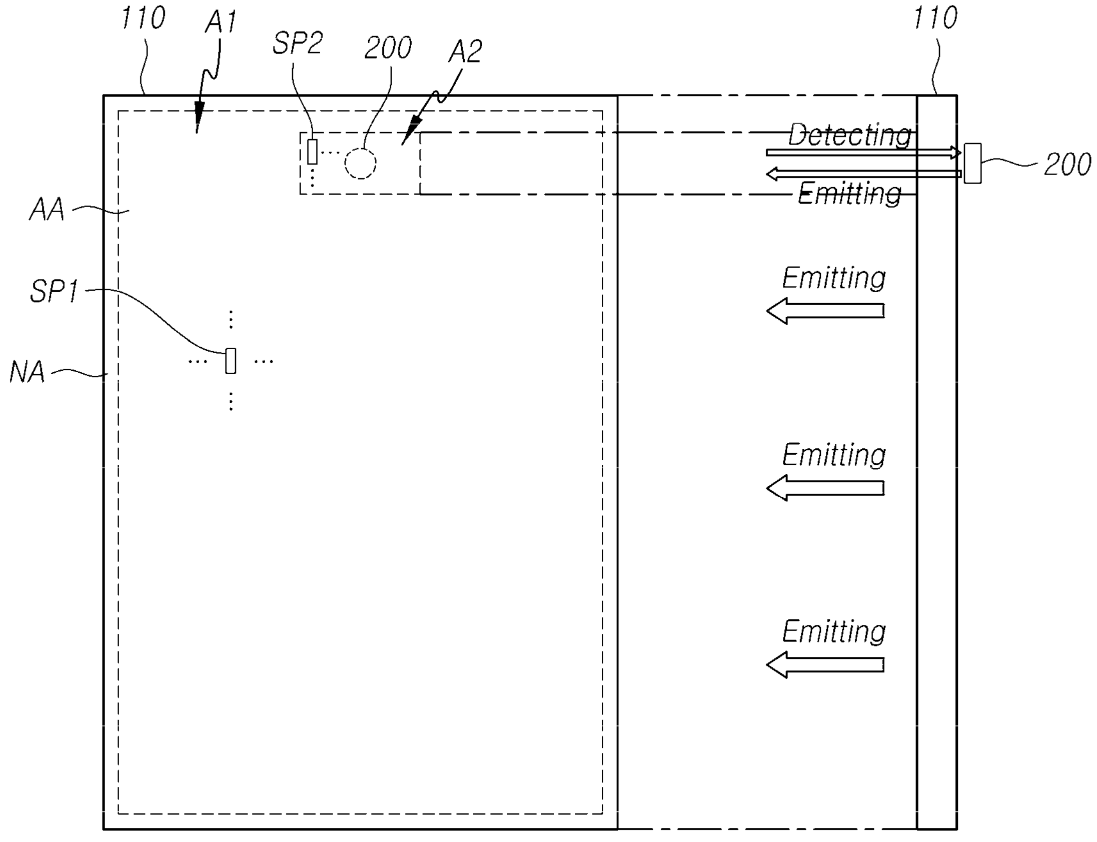
FIG. 4 is a view illustrating an example of a structure in which a display device includes an optical element according to embodiments of the disclosure.

FIG. 4 is a view illustrating an example of a structure in which a display device 100 includes an optical element 200 according to embodiments of the disclosure. In this example, the optical device 200 can be considered to include an aperture for an optical camera as well as the camera.

Referring to FIG. 4, the active area AA of the display panel 110 may include, e.g., a first area A1 and a second area A2. A plurality of first subpixels SP1 may be disposed in the first area A1. A plurality of second subpixels SP2 may be disposed in the second area A2.

The second area A2 may be an area with higher transparency (transmittance) than the first area A1, for example.

For example, the structure of the second subpixel SP2 disposed in the second area A2 may be different from the structure of the first subpixel SP1 disposed in the first area A1.

Alternatively, at least some of the circuit elements included in the second subpixel SP2 may be different from those included in the first subpixel SP1.

Alternatively, the number of second subpixels SP2 disposed in the unit area in the second area A2 may be different from the number of first subpixels SP1 disposed in the unit area in the first area A1. For example, the number of second subpixels SP2 disposed in the unit area in the second area A2 may be smaller than the number of first subpixels SP1 disposed in the unit area in the first area A1.

Since the transparency of the second area A2 is higher than that of the first area A1, the optical element 200 may be positioned in an area overlapping the second area A2.

For example, the optical element 200 may be positioned on a surface opposite to the surface on which the display panel 110 displays an image. The optical element 200 may be, e.g., one of optical devices that detect external light and perform sensing, such as camera sensors or infrared light sources, or emit light to the outside. In some cases, two or more optical elements 200 may be positioned on the rear surface of the display panel 110.

The optical element 200 may be positioned in an area overlapping the second area A2. For example, the second area A2 may be the same as the area where the optical element 200 is disposed. Alternatively, in some cases, the second area A2 may be larger or smaller in size than the area where the optical element 200 is disposed. Since the transparency of the second area A2 is higher than that of the first area A1, a large amount of external light may reach the optical element 200 positioned on the rear surface of the display panel 110 through the second area A2. In addition, any light emitted by the optical element 200 may be emitted forward of the display panel 110 through the second area A2.

Since the optical element 200 is positioned on the rear surface of the display panel 110 overlapping a partial area of the active area AA of the display panel 110, the optical element 200 may be disposed on the display panel 110 to provide an optical function without increasing the non-active area NA or decreasing the active area AA.

The second area A2 having relatively high transparency may have a lower pixel density, e.g., an image resolution lower than that of the first area A1.

Alternatively, at least some of the circuit elements included in the second subpixel SP2 disposed in the second area A2 may be configured to differ from those included in the first subpixel SP1 disposed in the first area A1. The image resolution of the second area A2 may be maintained to be the same as that of the first area A1, and the transparency of the second area A2 may be increased.

To increase the transparency of the second area A2, the structures in the pixels might be different, e.g., the structure of the storage capacitor Cst, which occupies a large area among the circuit elements disposed in the subpixel SP, may differ in the first area A1 and the second area A2.

The transparency of the storage capacitor Cst disposed in the second area A2 may be higher than the transparency of the storage capacitor Cst disposed in the first area A1.

At least a portion of the storage capacitor Cst disposed in the second area A2 may be disposed of, e.g., a highly transparent semiconductor material.

The storage capacitor Cst may be disposed using two or more semiconductor layers.

Hereinafter, the cross-sectional structures of the non-active area NA, the first area A1 and the second area A2 of the display panel 110 are compared, and an example structure of the storage capacitor Cst disposed in the second area A2 is described.

Figure 5:
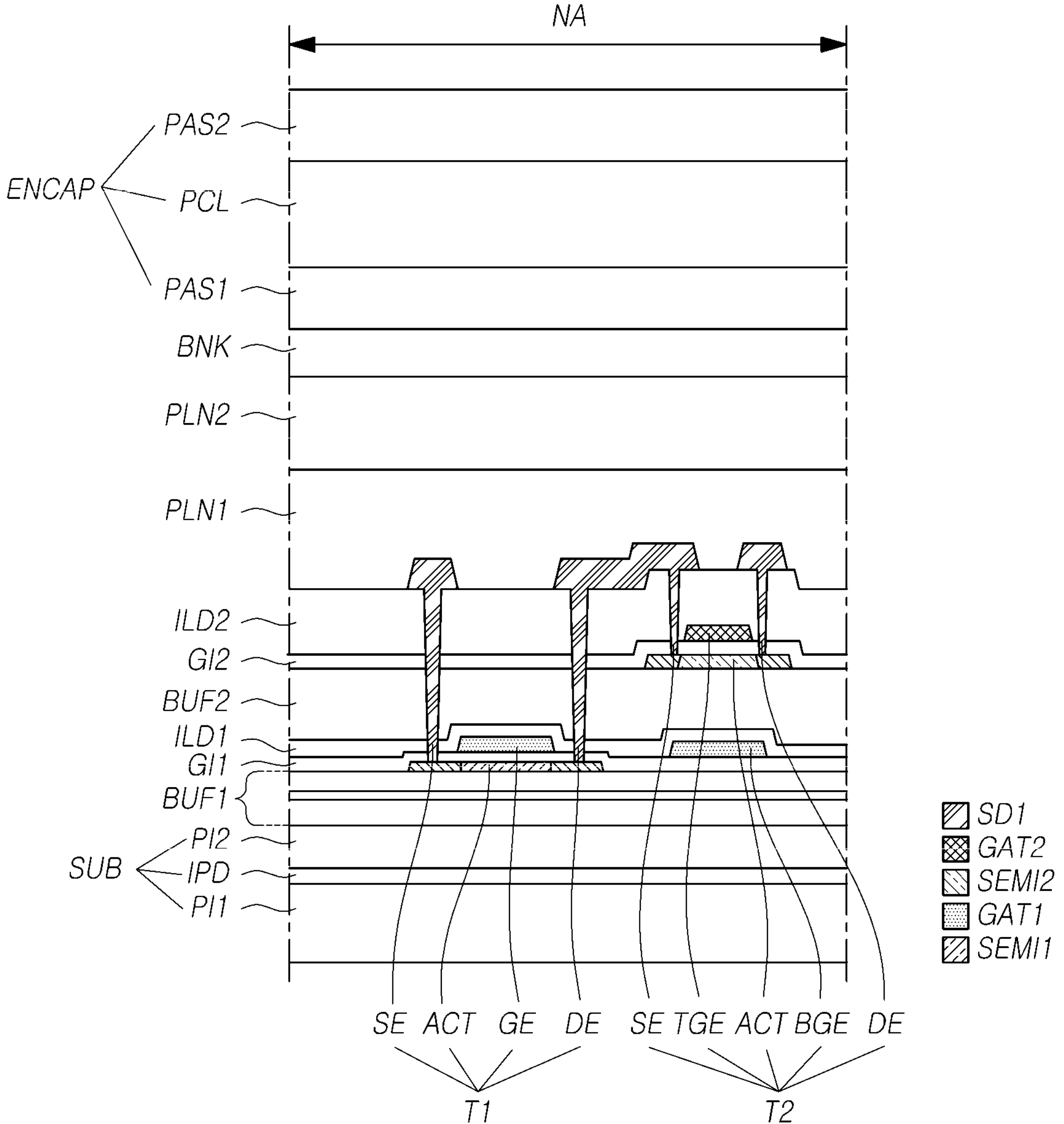
FIG. 5 is a view illustrating an example of a cross-sectional structure of part of a non-active area of the display device illustrated in FIG. 4.

FIG. 5 is a view illustrating an example of a cross-sectional structure of a part of the area of a non-active area NA of the display device 100 illustrated in FIG. 4. FIG. 5 illustrates an example circuit element included in a gate driving circuit 120 positioned in the non-active area NA of the display panel 110. FIG. 5 illustrates an example where the gate driving circuit 120 is disposed in a GIP form.

Referring to FIG. 5, a first buffer layer BUF1 may be disposed on the substrate SUB. The substrate SUB may be formed of a single layer or a plurality of layers. For example, the substrate SUB may include a first polyimide layer PI1, an inter-layer polyimide layer IPD, and a second polyimide layer PI2.

The first buffer layer BUF1 may include at least one insulating layer. For example, the first buffer layer BUF1 may include a plurality of layers, such as a multi-buffer layer and an active buffer layer.

The active layer ACT of the first transistor T1 formed of the first semiconductor layer SEMI1 may be disposed on the first buffer layer BUF1. The first semiconductor layer SEMI1 may be formed of, e.g., polycrystalline silicon.

A first gate insulating layer GI1 may be disposed on the active layer ACT of the first transistor T1.

The gate electrode GE of the first transistor T1 formed of the first gate electrode layer GAT1 may be disposed on the first gate insulating layer GI1. The bottom gate electrode BGE of the second transistor T2 formed of the first gate electrode layer GAT1 may be disposed on the first gate insulating layer GI1.

A first inter-layer insulating layer ILD1 may be disposed on the gate electrode GE of the first transistor T1 and the bottom gate electrode BGE of the second transistor T2.

A second buffer layer BUF2 may be disposed on the first inter-layer insulating layer ILD1.

The active layer ACT of the second transistor T2 formed of the second semiconductor layer SEMI2 may be disposed on the second buffer layer BUF2. The second semiconductor layer SEMI2 may be formed of, e.g., an oxide semiconductor.

A second gate insulating layer GI2 may be disposed on the active layer ACT of the second transistor T2.

The top gate electrode TGE of the second transistor T2 formed of the second gate electrode layer GAT2 may be disposed on the second gate insulating layer GI2.

A second inter-layer insulating layer ILD2 may be disposed on the top gate electrode TGE of the second transistor T2.

The source electrode SE and drain electrode DE of the first transistor T1 and the source electrode SE and drain electrode DE of the second transistor T2 may be disposed on the second inter-layer insulating layer ILD2. The source electrode SE and drain electrode DE of the first transistor T1 and the source electrode SE and drain electrode DE of the second transistor T2 may be disposed using the first source/drain electrode layer SD1.

The first planarization layer PLN1 and the second planarization layer PLN2 may be disposed overlying the source electrode SE and drain electrode DE of the first transistor T1 and the source electrode SE and drain electrode DE of the second transistor T2.

A bank layer BNK may be positioned on the second planarization layer PLN2.

An encapsulation layer ENCAP may be disposed on the bank layer BNK. The encapsulation layer ENCAP may include a first encapsulation layer PAS1, a second encapsulation layer PCL, and a third encapsulation layer PAS2. For example, the first encapsulation layer PAS1 and the third encapsulation layer PAS2 may be formed of an inorganic material. The second encapsulation layer PCL may be formed of an organic material.

The gate driving circuit 120 disposed in the non-active area NA may include a first transistor T1 and a second transistor T2 including different semiconductor layers.

The first transistor T1 may be, e.g., a transistor that controls a scan signal output from the gate driving circuit 120 to the gate line GL. The second transistor T2 may be a transistor that controls the driving timing of the first transistor T1. In some cases, the opposite may be the case.

The first transistor T1 and the second transistor T2 including channels formed of semiconductor layers having different characteristics may constitute the gate driving circuit 120, enhancing the operating performance of the gate driving circuit 120. Similarly, the transistor disposed in the subpixel SP may be positioned on the same layer as at least one of the first transistor T1 or the second transistor T2.

Only one type of the first transistor T1 or the second transistor T2 may be disposed in the subpixel SP, or the first transistor T1 and the second transistor T2 may be mixed and disposed in the subpixel SP.

Figure 6:
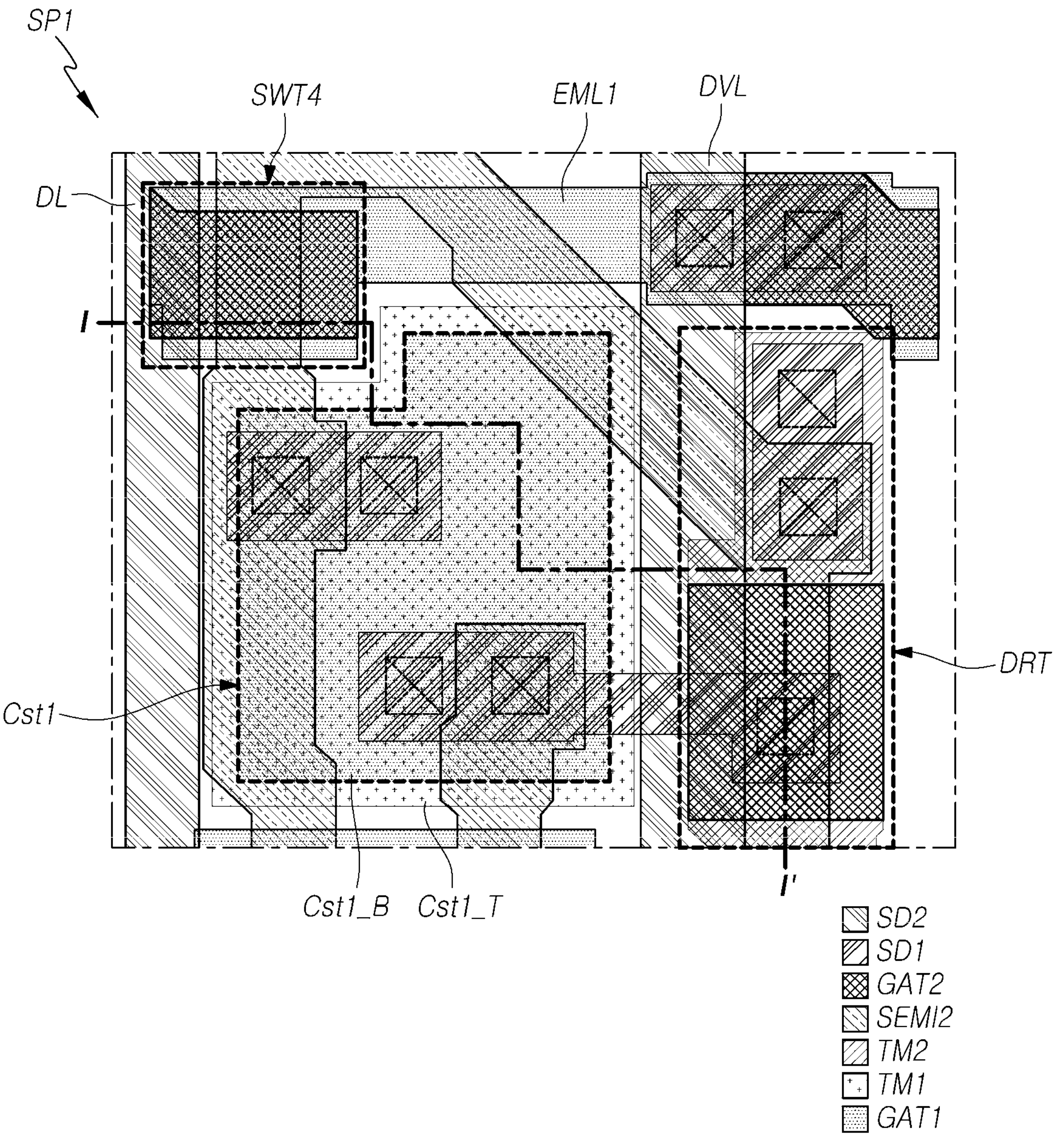
FIG. 6 is a view illustrating an example of a top plan view of a first subpixel disposed in a first area of an active area of the display device illustrated in FIG. 4.
Figure 7:
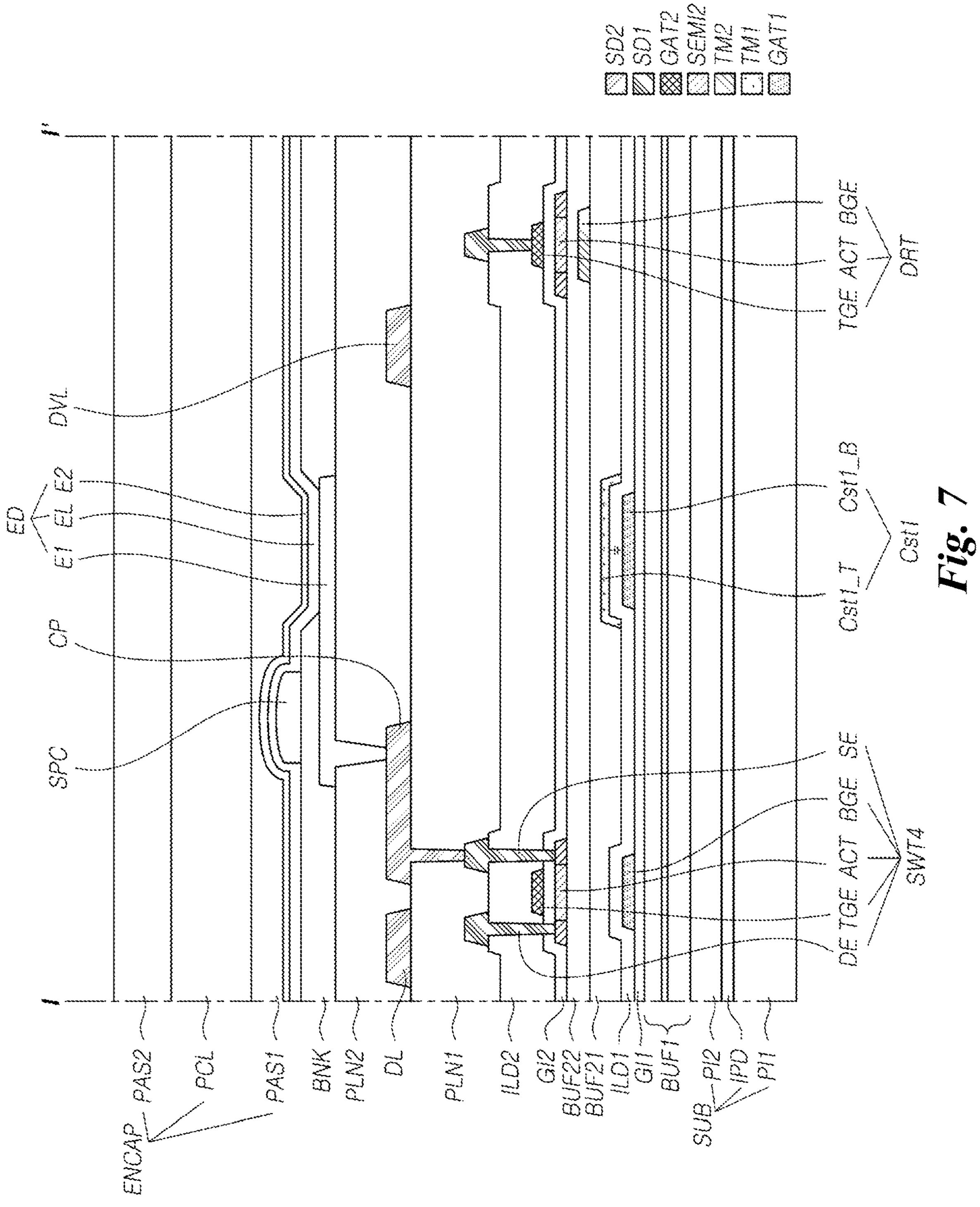
FIG. 7 is a cross-sectional view illustrating an example structure, taken along line I-I' of FIG. 6.
Figure 8:
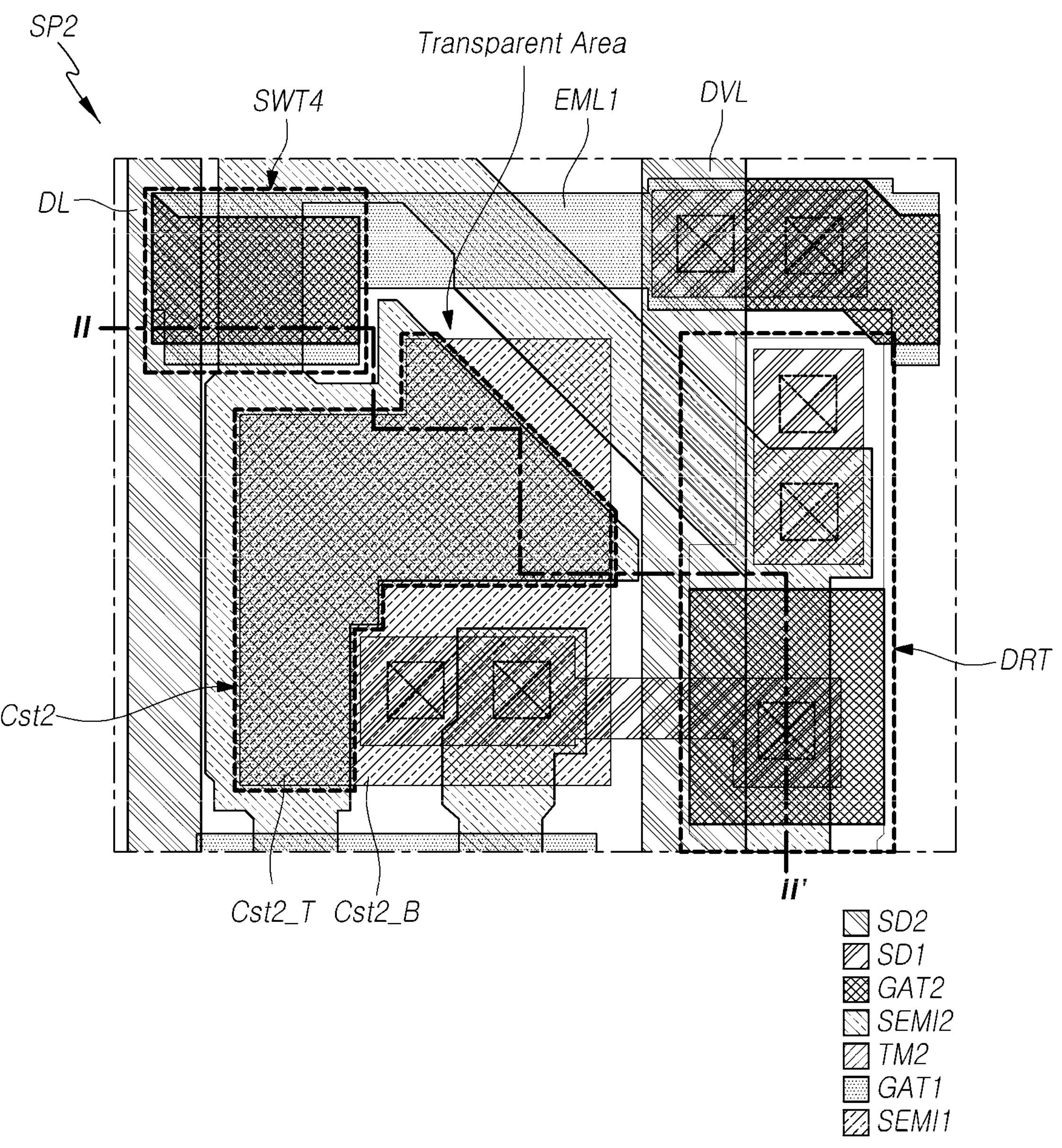
FIG. 8 is a view illustrating an example of a top plan view of a second subpixel disposed in a second area of an active area of the display device illustrated in FIG. 4.
Figure 9:
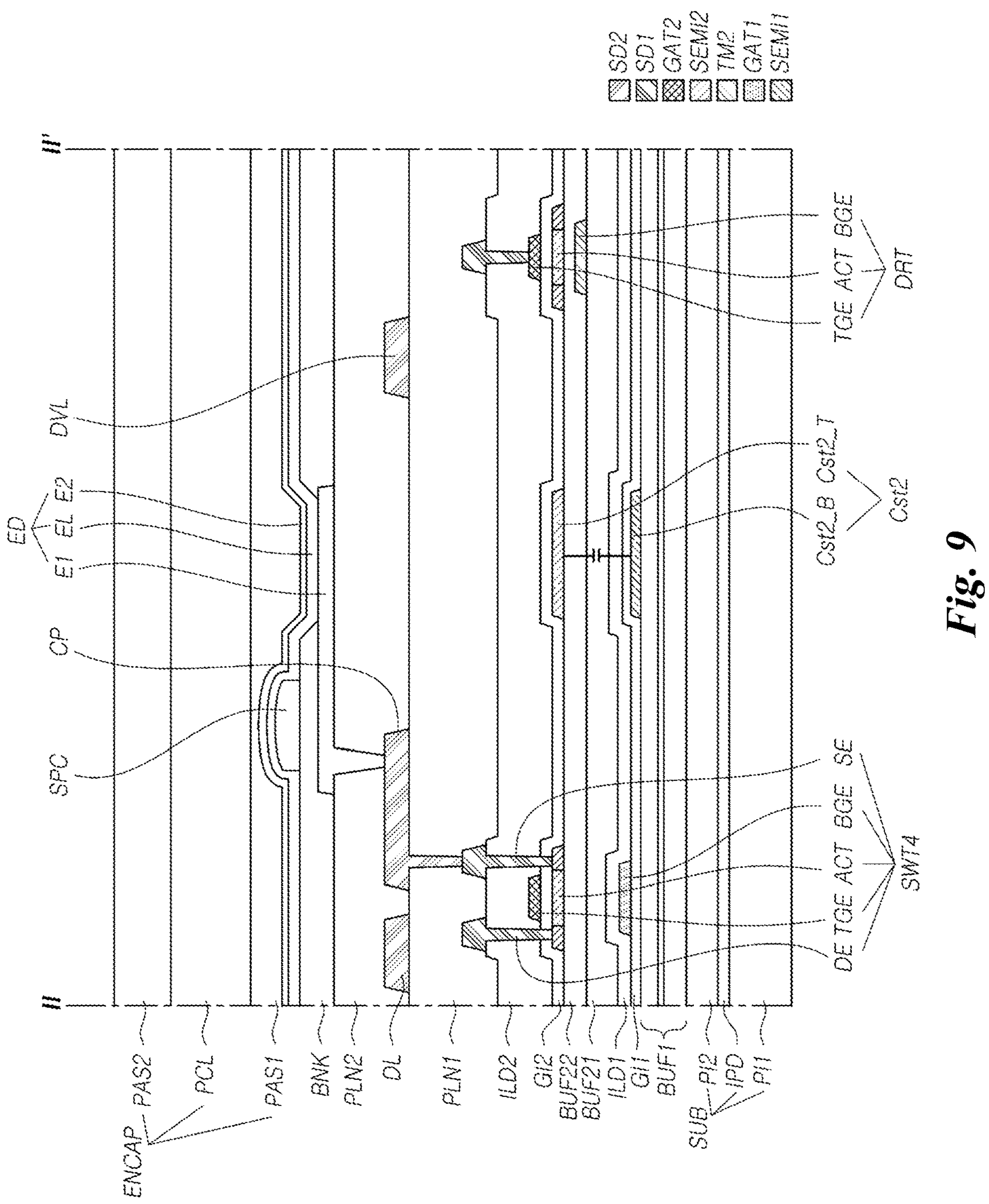
FIG. 9 is a cross-sectional view taken along line II-II' of FIG. 8.

FIG. 6 is a view illustrating an example of a top plan view of a first subpixel SP1 disposed in a first area A1 of an active area AA of the display device 100 illustrated in FIG. 4. FIG. 7 is a cross-sectional view illustrating an example structure, taken along line I-I' of FIG. 6. FIG. 8 is a view illustrating an example of a top plan view of a second subpixel SP2 disposed in a second area A2 of an active area AA of the display device 100 illustrated in FIG. 4. FIG. 9 is a cross-sectional view taken along line II-II' of FIG. 8.

FIGS. 6 to 9 exemplarily show the area where the storage capacitor Cst is disposed in the subpixel SP. The subpixel SP shown in FIGS. 6 to 9 exemplarily represents the subpixel SP described with reference to FIG. 2 and exemplarily represents the portion where the fourth switching transistor SWT4 and the driving transistor DRT are disposed around the storage capacitor Cst. In FIGS. 6 to 9, a description of the same layer as the layer described through FIG. 5 may be omitted.

Referring to FIGS. 6 and 7, in the first subpixel SP1, the data line DL and the driving voltage line DVL may be disposed along one direction.

The first emission control line EML1 may be disposed along a direction crossing the one direction.

The first subpixel SP1 disposed in the first area A1 of the active area AA may include a first storage capacitor Cst1. A fourth switching transistor SWT4 and a driving transistor DRT may be disposed in the first subpixel SP1.

For example, the fourth switching transistor SWT4 and the driving transistor DRT may use the same semiconductor layer as a channel. In some cases, embodiments of the disclosure may be applied even when the semiconductor layer constituting the fourth switching transistor SWT4 is different from the semiconductor layer constituting the driving transistor DRT.

The structures shown in FIGS. 6 and 7 are described by way of example. The fourth switching transistor SWT4 may include, e.g., an active layer ACT, a top gate electrode TGE, a bottom gate electrode BGE, a source electrode SE, and a drain electrode DE.

The driving transistor DRT may include, e.g., an active layer ACT, a top gate electrode TGE, and a bottom gate electrode BGE. Although not shown, the driving transistor DRT may include a source electrode and a drain electrode.

Both the active layer ACT of the fourth switching transistor SWT4 and the active layer ACT of the driving transistor DRT may be disposed using the second semiconductor layer.

Both the top gate electrode TGE of the fourth switching transistor SWT4 and the top gate electrode TGE of the driving transistor DRT may be disposed using the second gate electrode layer GAT2.

The source electrode SE and the drain electrode DE of the fourth switching transistor SWT4 may be disposed using the first source/drain electrode layer SD1. The case of the driving transistor DRT may be the same.

The bottom gate electrode BGE of the fourth switching transistor SWT4 may be disposed using, e.g., the first gate electrode layer GAT1. The bottom gate electrode BGE of the driving transistor DRT may be disposed using, e.g., the second auxiliary electrode layer TM2.

The second auxiliary electrode layer TM2 may be positioned on a layer higher than the first gate electrode layer GAT1. The second auxiliary electrode layer TM2 may be positioned between the second lower buffer layer BUF21 and the second upper buffer layer BUF22. The active layer ACT of the fourth switching transistor SWT4 and the active layer ACT of the driving transistor DRT may be positioned on the second upper buffer layer BUF22.

A distance between the active layer ACT and the bottom gate electrode BGE of the driving transistor DRT may be smaller than a distance between the active layer ACT and the bottom gate electrode BGE of the fourth switching transistor SWT4.

The driving characteristics of the driving transistor DRT and the driving characteristics of the fourth switching transistor SWT4 may be set to differ by making the distance between the active layer ACT and the bottom gate electrode BGE different in the driving transistor DRT and the fourth switching transistor SWT4. Even when the driving transistor DRT and the fourth switching transistor SWT4 use the same semiconductor layer as a channel, the driving transistor DRT and the fourth switching transistor SWT4 may have the driving characteristics set to differ by the arrangement structure of the bottom gate electrode BGE.

In the structure for each of FIGS. 6-9, as best seen in the crosssections of FIGS. 7 and 9, a conductive layer is formed on the first planarization layers PLN1. This conductive layer can be comprised of any acceptable conductive material, preferrably a highly conductive such aluminum, nickel, tungsten, or alloys of each of them. Other conductors, such as ITO can also be used. In some instances copper and other conductors that is compatable with the process technology. A data line DL, a connection pattern CP, a driving voltage line DVL, and the like may be formed from this conductive layer by appropriate pattern and etching. Thus each of these conductors patterns can be formed from the same metal layer and disposed on the first planarization layer PLN1. This same conductive layer can also provide the second source/drain electrode layer SD2. Namely, the connection pattern CP provides the electrical contact to one of the source and/or drain of the drive transistor to the first electrode E1 of the emitting device ED. It can also provide other electrical connections to different circuits and devices on the chip, two examples of which are DL and DVL as shown, which are connected to other layers in locations not shown in FIGS. 7 and 9. Thus, the connection pattern is used for pixels in both Area A1 and Area A2.

It is permissible to form this connection pattern of the same or different conductors each of the areas A1 and A2 in the different embodiments. In one embodiment, the same metals are used for this metal layer that provides the DVL, CP and DL, such as aluminum in both A1 and A2. In other embodiments, a first metal, such as aluminum is used in first area A1 and a generally transparent conductor, such as ITO, AZO, FTO, NTO or the like can be used in the second area A2.

The fourth switching transistor SWT4 may be electrically connected to the first electrode layer E1 of the light emitting element ED through the connection pattern CP.

A second planarization layer PLN2 may be disposed on the data line DL, the connection pattern CP, and the driving voltage line DVL. The first electrode layer E1 of the light emitting element ED and the bank layer BNK may be disposed on the second planarization layer PLN2. A light emitting layer EL and a second electrode layer E2 may be disposed on the first electrode layer E1 and the bank layer BNK. A spacer SPC may be disposed in a partial area on the bank layer BNK.

An encapsulation layer ENCAP may be disposed on the light emitting element ED.

The first storage capacitor Cst1 may include a first lower capacitor electrode Cst1_B and a first upper capacitor electrode Cst1_T.

The first lower capacitor electrode Cst1_B may be made of the same material and be formed at the same time as the first gate electrode layer GAT1. The first upper capacitor electrode Cst1_T may be made of the same material and be formed at the same time as the first auxiliary electrode layer TM1. This material can be any of the many known acceptable gate electrode materials, including semiconductors or metals, such as polysilicon, a heavy doped polysilicon, a silicide polysilicon, W, WN, TiN, TaN or the like.

A first inter-layer insulating layer ILD1 as a dielectric may be disposed between the first lower capacitor electrode Cst1_B and the first upper capacitor electrode Cst1_T.

The area of the first upper capacitor electrode Cst1_T may be different from the area of the first lower capacitor electrode Cst1_B. For example, the area of the first upper capacitor electrode Cst1_T may be larger than the area of the first lower capacitor electrode Cst1_B.

A portion of the first upper capacitor electrode Cst1_T may be disposed on an inclined surface of the first inter-layer insulating layer ILD1 positioned under the first upper capacitor electrode Cst1_T.

In some cases, the first upper capacitor electrode Cst1_T may be positioned on the same layer as the bottom gate electrode BGE of the driving transistor DRT. Namely, the first upper capacitor electrode might be on layer BUF21.

Alternatively, as in the example shown in FIG. 7, the first upper capacitor electrode Cst1_T may be formed using the first auxiliary electrode layer TM1, and the bottom gate electrode BGE of the driving transistor DRT may be formed using the second auxiliary electrode layer TM2.

The thickness of the first upper capacitor electrode Cst1_T disposed using the first auxiliary electrode layer TM1 may differ from the thickness of the bottom gate electrode BGE of the driving transistor DRT disposed using the second auxiliary electrode layer TM2. For example, the thickness of the first upper capacitor electrode Cst1_T may be larger than the thickness of the bottom gate electrode BGE of the driving transistor DRT. Since the first upper capacitor electrode Cst1_T and the bottom gate electrode BGE of the driving transistor DRT are disposed using different electrode layers, electrodes constituting each circuit element may be disposed to be appropriate for the process characteristics or driving characteristics of the transistors.

As in the above-described example, the first storage capacitor Cst1 disposed in the first subpixel SP1 is disposed using the first gate electrode layer GAT1 and the first auxiliary electrode layer TM1 and are thus constituted of layers adjacent to each other.

The second storage capacitor Cst2 disposed in the second subpixel SP2 may be disposed using a layer different from the electrode layer constituting the first storage capacitor Cst1 to increase the transparency of the second area A2.

Referring to FIGS. 8 and 9, the data line DL and the driving voltage line DVL may be disposed along one direction in the second subpixel SP2 disposed in the second area A2. The first emission control line EML1 may be disposed along a direction crossing the data line DL.

A second storage capacitor Cst2 may be disposed in the second subpixel SP2. A fourth switching transistor SWT4 and a driving transistor DRT may be positioned around the second storage capacitor Cst2.

The arrangement structure of the fourth switching transistor SWT4 and the driving transistor DRT disposed in the second subpixel SP2 may be the same as that of the first subpixel SP1.

The arrangement structure of the second storage capacitor Cst2 disposed in the second subpixel SP2 may be different from the arrangement structure of the first storage capacitor Cst1 disposed in the first subpixel SP1.

The second storage capacitor Cst2 may include a second lower capacitor electrode Cst2_B and a second upper capacitor electrode Cst2_T.

The second lower capacitor electrode Cst2_B may be disposed using, e.g., the first semiconductor layer SEMI1. The second lower capacitor electrode Cst2_B may be an electrode formed of polycrystalline silicon turned into a conductor. It can be turned into a conductor by any acceptable technique, many of which are known the art, including doping it heavily with either N or P type dopants when it is being formed, after it is formed, including a process step of providing a metal silicide layer or other technique.

The second lower capacitor electrode Cst2_B may be disposed between the first buffer layer BUF1 and the first gate insulating layer GI1. The second lower capacitor electrode Cst2_B may be positioned on the same layer as the active layer ACT of the first transistor T1 disposed in the non-active area NA. The second lower capacitor electrode Cst2_B may be positioned on the same layer as the active layer of some transistors included in the gate driving circuit 120.

In some cases, the second lower capacitor electrode Cst2_B may be positioned on the same layer as the active layer of the transistor disposed in the active area AA. As an example, FIG. 8 and FIG. 9 illustrate a structure in which a channel is formed in both the fourth switching transistor SWT4 and the driving transistor DRT using the second semiconductor layer SEMI2, but at least some of the transistors may be formed using the first semiconductor layer SEMI1. In this case, the second lower capacitor electrode Cst2_B may be positioned on the same layer as the active layer of the transistor in the subpixel SP.

The second upper capacitor electrode Cst2_T may be disposed using any acceptable transparent conductor or semiconductor, e.g., the second semiconductor layer SEMI2. The second upper capacitor electrode Cst2_T may be an electrode formed of an oxide semiconductor turned into a conductor. It can be turned into a conductor by any acceptable technique, many of which are known the art, including doping it heavily with either N or P type dopants when it is being formed, after it is formed, adding or increasing a metal content or other technique.

The second upper capacitor electrode Cst2_T may be positioned between the second upper buffer layer BUF22 and the second gate insulating layer GI2. The second upper capacitor electrode Cst2_T may be positioned on the same layer as the active layer ACT of the fourth switching transistor SWT4. The second upper capacitor electrode Cst2_T may be positioned on the same layer as the active layer ACT of the driving transistor DRT.

The second upper capacitor electrode Cst2_T may be positioned on the same layer as the active layer of the transistor disposed in the first subpixel SP1. Further, the second upper capacitor electrode Cst2_T may be positioned on the same layer as the active layer of some transistors included in the gate driving circuit 120 positioned in the non-active area NA.

The area of the second upper capacitor electrode Cst2_T may be different from the area of the second lower capacitor electrode Cst2_B. Since the second upper capacitor electrode Cst2_T is positioned on the same layer as the active layer of the transistor disposed in the second subpixel SP2, the area of the second upper capacitor electrode Cst2_T may be smaller than the area of the second lower capacitor electrode Cst2_B.

Since the second storage capacitor Cst2 is constituted of the first semiconductor layer SEMI1 and the second semiconductor layer SEMI2, the transparency of the second storage capacitor Cst2 may be higher than the transparency of the first storage capacitor Cst1.

The area where the second storage capacitor Cst2 is disposed in the second subpixel SP2 may be a transparent area. The area where no line is disposed in the surrounding area of the second storage capacitor Cst2 in the second subpixel SP2 may be a transparent area.

The transparency of the second subpixel SP2 may be enhanced, and the transparency of the second area A2 where the second subpixel SP2 is disposed may be enhanced. The optical performance of the optical element 200 overlapping the second area A2 and positioned on the rear surface of the substrate SUB may be enhanced.

The resolution of the second area A2 may be maintained to be the same as that of the first area A1, and the transparency of the second area A2 may be enhanced. Alternatively, in some cases, the resolution of the second area A2 may be lower than that of the first area A1. The number of second subpixels SP2 disposed in the unit area in the second area A2 may be smaller than the number of first subpixels SP1 disposed in the unit area in the first area A1. Since the area where the second subpixel SP2 is disposed in the second area A2 is reduced and the high-transparency second storage capacitor Cst2 is disposed, the transparency of the second area A2 may be further increased.

The first storage capacitor Cst1 disposed in the first subpixel SP1 positioned in the first area A1 may be formed of an opaque electrode as in the above-described example and the electrodes of the second storage capacitor can be formed of a transparent conductor. For example, in one embodiment, the electrodes of first storage capacitor Cst1 can comprised of aluminum or an alloy thereof and the second storage capacitor Cst2 can be comprised of ITO, AZO or transparent conductor. Alternatively, in some cases, the first storage capacitor Cst1 can be constituted using the same layer and same materials as the second storage capacitor Cst2. For example, the first lower capacitor electrode Cst1_B of the first storage capacitor Cst1 may be disposed using the first semiconductor layer SEMI1. The first upper capacitor electrode Cst1_T of the first storage capacitor Cst1 may be disposed using the second semiconductor layer SEMI2. The first storage capacitor Cst1 and the second storage capacitor Cst2 may be disposed to enhance process convenience, and the transparency of the second area A2 may also be enhanced. For example, the second storage capacitor Cst2 can be more considered more transparent within the pixels in the area A2 because it is smaller, either in relative size or absolute size in the subpixel within the area A2. Since its area is smaller within the sub-pixels in the Area A2, the electrodes of the capacitor block less light and thus, overall the area occupied by the subpixel in the area A2 is more transparent than the area occupied by sub-pixel in area A1 because the second storage capacitor Cst2 takes up less area.

When the second storage capacitor Cst2 is disposed using a different layer from the first storage capacitor Cst1, the distance between the two electrodes of the second storage capacitor Cst2 may differ from the distance between the two electrodes of the first storage capacitor Cst1.

For example, the distance between the second lower capacitor electrode Cst2_B and the second upper capacitor electrode Cst2_T may be larger than the distance between the first lower capacitor electrode Cst1_B and the first upper capacitor electrode Cst1_T.

The area of the second storage capacitor Cst2 and the area of the first storage capacitor Cst1 may be different considering the distance between the two electrodes constituting each storage capacitor Cst.

Alternatively, the area of the second storage capacitor Cst2 and the area of the first storage capacitor Cst1 may be equal to or similar to each other. In one embodiment, the area of the second storage capacitor Cst2 may be less than the area of the first storage capacitor Cst1, thus the transparency of the subpixel in the area A2 will be greater than for the subpixel in the area A1 because the capacitor Cst2 takes up less area than that of Cst1.

In this case, the data voltage Vdata supplied to the second subpixel SP2 may be set to differ from the data voltage Vdata supplied to the first subpixel SP1 to reduce a deviation that may occur in display driving or the threshold voltage of the driving transistor DRT. Different data voltages Vdata corresponding to the same grayscale may be supplied to the first subpixel SP1 and the second subpixel SP2. For example, the data voltage Vdata reflecting a correction value may be supplied to the second subpixel SP2.

As such, it is possible to prevent a driving abnormality due to a difference in structure between the storage capacitors Cst disposed in the first subpixel SP1 and the second subpixel SP2 while increasing the transparency of the second area A2 by disposing the second storage capacitor Cst2 using the first semiconductor layer SEMI1 and the second semiconductor layer SEMI2.

The foregoing embodiments are briefly described below.

A display device 100 according to embodiments of the disclosure may comprise a substrate SUB including a first area A1 where a plurality of first subpixels SP1 are positioned and a second area A2 where a plurality of second subpixels SP2 are positioned, a first storage capacitor Cst1 disposed in each of the plurality of first subpixels SP1 and including a first upper capacitor electrode Cst1_T and a first lower capacitor electrode Cst1_B, and a second storage capacitor Cst2 disposed in each of the plurality of second subpixels SP2 and including a second upper capacitor electrode Cst2_T and a second lower capacitor electrode Cst2_B, wherein at least one of the second upper capacitor electrode Cst2_T or the second lower capacitor electrode Cst2_B has a greater transparency than the first upper capacitor electrode Cst1_T and the first lower capacitor electrode Cst1_B.

The second upper capacitor electrode Cst2_T may be positioned on a layer where an active layer included in a thin film transistor disposed in each of the plurality of second subpixels SP2 is disposed.

The second upper capacitor electrode Cst2_T may be positioned on a layer where an active layer included in a thin film transistor disposed in each of the plurality of first subpixels SP1 is disposed.

The second lower capacitor electrode Cst2_B may be positioned on a layer where an active layer included in a thin film transistor disposed in a driving circuit positioned on the substrate SUB is disposed.

The first lower capacitor electrode Cst1_B may be positioned on a layer where a gate electrode included in a thin film transistor disposed in a driving circuit is disposed.

The second upper capacitor electrode Cst2_T and the second lower capacitor electrode Cst2_B may be formed of a transparent semiconductor material turned into a conductor. It can be turned into a conductor by any acceptable technique, many of which are known the art, including doping it heavily with either N or P type dopants when it is being formed, after it is formed, adding or increasing a metal content or other technique.

The second upper capacitor electrode Cst2_T may be formed of a material different from a material of the second lower capacitor electrode Cst2_B.

The first upper capacitor electrode Cst1_T may be positioned between a layer where the second upper capacitor electrode Cst2_T is disposed and a layer where the second lower capacitor electrode Cst2_B is disposed.

The first lower capacitor electrode Cst1_B may be positioned between a layer where the second upper capacitor electrode Cst2_T is disposed and a layer where the second lower capacitor electrode Cst2_B is disposed.

A distance between the second upper capacitor electrode Cst2_T and the second lower capacitor electrode Cst2_B may be larger than a distance between the first upper capacitor electrode Cst1_T and the first lower capacitor electrode Cst1_B.

An area of at least one of the second upper capacitor electrode Cst2_T or the second lower capacitor electrode Cst2_B may be different from an area of at least one of the first upper capacitor electrode Cst1_T or the first lower capacitor electrode Cst1_B.

An area of the first upper capacitor electrode Cst1_T may be larger than an area of the first lower capacitor electrode Cst1_B, and an area of the second upper capacitor electrode Cst2_T may be smaller than an area of the second lower capacitor electrode Cst2_B. The area of each the second upper capacitor electrode Cst2_T and the second lower capacitor electrode Cst2_B may be smaller than an area of each of the first upper capacitor electrode Cst1_T and the first lower capacitor electrode Cst1_B.

An upper surface of an insulating layer contacting a lower surface of the second upper capacitor electrode Cst2_T may be a planarized surface.

A portion of the first upper capacitor electrode Cst1_T may be disposed on an inclined surface of an insulating layer positioned between the first upper capacitor electrode Cst1_T and the first lower capacitor electrode Cst1_B.

A number of the plurality of second subpixels SP2 positioned in a unit area in the second area A2 may be smaller than a number of the plurality of first subpixels SP1 positioned in the unit area in the first area A1.

The first upper capacitor electrode Cst1_T may be positioned between the substrate SUB and a layer where a lower gate electrode included in a first thin film transistor among a plurality of thin film transistors respectively disposed in the plurality of first subpixels SP1 is disposed.

The first upper capacitor electrode Cst1_T may be larger in thickness than the lower gate electrode.

The first upper capacitor electrode Cst1_T may be positioned between a layer where a lower gate electrode included in a second thin film transistor among the plurality of thin film transistors is disposed and a layer where an active layer of the second thin film transistor is disposed.

The display device 100 may further comprise at least one optical element 200 positioned on a rear surface of the substrate SUB and overlapping at least a portion of the second area A2.

A display device 100 according to embodiments of the disclosure may comprise a substrate SUB including a first area A1 where a plurality of first subpixels SP1 are positioned and a second area A2 where a plurality of second subpixels SP2 are positioned and a storage capacitor Cst disposed in at least one of the plurality of first subpixels SP1 or the plurality of second subpixels SP2 and including a lower capacitor electrode formed of a first semiconductor material and an upper capacitor electrode formed of a second semiconductor material different from the first semiconductor material.

According to one embodiment, there is a display device, comprising:

a substrate including a first area where a plurality of first subpixels are positioned and a second area where a plurality of second subpixels are positioned;

a first storage capacitor disposed in each of the plurality of first subpixels and including a first upper capacitor electrode and a first lower capacitor electrode; and a second storage capacitor disposed in each of the plurality of second subpixels and including a second upper capacitor electrode and a second lower capacitor electrode, wherein at least one of the second upper capacitor electrode or the second lower capacitor electrode is larger in transparency than the first upper capacitor electrode and the first lower capacitor electrode.

There can also be a display device wherein the second upper capacitor electrode is positioned on a layer where an active layer included in a thin film transistor in each of the plurality of second subpixels is disposed.

There can also be a display device wherein the second upper capacitor electrode is positioned on a layer where an active layer included in a thin film transistor in each of the plurality of first subpixels is disposed.

There can also be a display device wherein the second lower capacitor electrode is positioned on a layer where an active layer included in a thin film transistor in a driving circuit positioned on the substrate is disposed.

There can also be a display device wherein the first lower capacitor electrode is positioned on a layer where a gate electrode included in the thin film transistor in the driving circuit is disposed.

There can also be a display device wherein the second upper capacitor electrode and the second lower capacitor electrode are formed of a transparent semiconductor material turned into a conductor.

There can also be a display device wherein the second upper capacitor electrode is formed of a material different from a material of the second lower capacitor electrode.

There can also be a display device wherein the first upper capacitor electrode is positioned between a layer where the second upper capacitor electrode is disposed and a layer where the second lower capacitor electrode is disposed.

There can also be a display device wherein the first lower capacitor electrode is positioned between a layer where the second upper capacitor electrode is disposed and a layer where the second lower capacitor electrode is disposed.

In one embodiment, the second upper capacitor electrode is converted into a conductor by heavily doping the semiconductor material with a sufficient amount of dopant that it becomes a conductor.

There can also be a display device wherein a distance between the second upper capacitor electrode and the second lower capacitor electrode is larger than a distance between the first upper capacitor electrode and the first lower capacitor electrode.

There can also be a display device wherein an area of at least one of the second upper capacitor electrode or the second lower capacitor electrode is different from an area of at least one of the first upper capacitor electrode or the first lower capacitor electrode.

There can also be a display device wherein an area of the first upper capacitor electrode is larger than an area of the first lower capacitor electrode, and an area of the second upper capacitor electrode is smaller than an area of the second lower capacitor electrode.

There can also be a display device wherein an upper surface of an insulating layer contacting a lower surface of the second upper capacitor electrode is planarized.

There can also be a display device wherein a portion of the first upper capacitor electrode is disposed on an inclined surface of an insulating layer positioned between the first upper capacitor electrode and the first lower capacitor electrode.

There can also be a display device wherein a number of the plurality of second subpixels positioned in a unit area in the second area is smaller than a number of the plurality of first subpixels positioned in the unit area in the first area.

There can also be a display device wherein the first upper capacitor electrode is positioned between the substrate and a layer where a lower gate electrode included in a first thin film transistor among a plurality of thin film transistors respectively disposed in the plurality of first subpixels is disposed.

There can also be a display device wherein the first upper capacitor electrode is larger in thickness than the lower gate electrode.

There can also be a display device wherein the first upper capacitor electrode is positioned between a layer where a lower gate electrode included in a second thin film transistor among the plurality of thin film transistors is disposed and a layer where an active layer of the second thin film transistor is disposed.

There can also be a display device further comprising at least one optical element positioned on a rear surface of the substrate and overlapping at least a portion of the second area.

There can also be a display device wherein a resolution of the second area is lower than or same as that of the first area, and the transparency of the second area is larger than that of the first area.

There can also be a display device comprising:

- a substrate including a first area where a plurality of first subpixels are positioned and a second area where a plurality of second subpixels are positioned; and
- a storage capacitor disposed in at least one of the plurality of first subpixels or the plurality of second subpixels and including a lower capacitor electrode formed of a first semiconductor material and an upper capacitor electrode formed of a second semiconductor material different from the first semiconductor material.

There can also be a display device wherein the storage capacitor comprises:

- a first storage capacitor disposed in each of the plurality of first subpixels and including a first upper capacitor electrode and a first lower capacitor electrode; and
- a second storage capacitor disposed in each of the plurality of second subpixels and including a second upper capacitor electrode and a second lower capacitor electrode, wherein at least one of the second upper capacitor electrode or the second lower capacitor electrode is larger in transparency than the first upper capacitor electrode and the first lower capacitor electrode.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

- a substrate including a first area having a plurality of first subpixels and a second area having a plurality of second subpixels;
- a light emitting diode disposed in each of the first subpixels and second subpixels, each light emitting diodes including an anode and a cathode;
- a driving transistor disposed in each of the first subpixels and second subpixels, each driving transistor having a gate electrode, a first terminal electrically coupled to a power supply source, and a second terminal electrically coupled to at least one of the anode or the cathode of the light emitting diode;
- a first storage capacitor disposed in each of the first subpixels, the first storage capacitor having a first electrode and a second electrode; and
- a second storage capacitor disposed in each of the second subpixels, the second storage capacitor having a first electrode and a second electrode,
- wherein the first electrode of the first storage capacitor is directly connected to the gate electrode of the driving transistor in each of the first subpixels,
- wherein the first electrode of the second storage capacitor is directly connected to the gate electrode of the driving transistor in each of the second subpixels,
- wherein, in each of the second subpixels, the first electrode and the second electrode of the second storage capacitor are respectively disposed in layers corresponding to active layers of different transistors and are formed of transparent semiconductor materials, and
- wherein an optical transparency a of the second capacitor is greater than an optical transparency of the first storage capacitor.

2. The display device of claim 1 wherein the transparent semiconductor material includes an oxide semiconductor.

3. The display device of claim 1 wherein the first electrode of the second storage capacitor is formed of a transparent semiconductor material disposed on a same layer as an active layer of the driving transistor, and the second electrode of the second storage capacitor is formed of a transparent semiconductor material disposed on a same layer as an active layer of a switching transistor.

4. The display device of claim 1 wherein a transparency of each of the first electrode and the second electrode of the second storage capacitor is higher than an optical transparency of the first electrode of the first storage capacitor.

5. The display device of claim 1 wherein a transparency of each of the first electrode and the second electrodes of the second storage capacitor is higher than an optical transparency of the second electrode of the first storage capacitor.

6. The display device of claim 1 wherein optical transparencies of both the first electrode and the second electrode of the second storage capacitor are higher than optical transparencies of both the first electrode and the second electrode of the first storage capacitor.

7. The display device of claim 1, wherein the number of second subpixels disposed in the unit area in the second area is smaller than the number of first subpixels disposed in the unit area in the first area.

8. The display device of claim 1, wherein an absolute area of the second storage capacitor is smaller than an absolute area of the first storage capacitor.

9. The display device of claim 1, wherein a planar area of the second storage capacitor is smaller than a planar area of the first storage capacitor.

10. The display device of claim 9, wherein a ratio of an area of the second storage capacitor to an area of each second subpixel is smaller than a ratio of an area of the first storage capacitor to an area of each first subpixel.

11. The display device of claim 1, wherein an area of at least one of the first electrode or the second electrode of the first storage capacitor is different from an area of at least one of the first electrode or the second electrode of the second storage capacitor.

12. The display device of claim 1, wherein an area of the first electrode of the second storage capacitor is smaller than an area of the second electrode of the second storage capacitor.

13. A display device, comprising:

a substrate including a first area having a plurality of first subpixels and a second area having a plurality of second subpixels;

a light emitting diode disposed in each of the first subpixels and the second subpixels, each light emitting diode having an anode and a cathode;

a storage capacitor disposed in each of the first subpixels and the second subpixels, each storage capacitor having a first electrode and a second electrode;

a driving transistor disposed in each of the first subpixels and the second subpixels, each driving transistor having a gate electrode directly connected to the first electrode of the storage capacitor, a first terminal electrically coupled to a driving voltage line, and a second terminal electrically coupled to one of the anode or the cathode of the light emitting diode; and a connection pattern disposed on a same layer as the driving voltage line, interposed between electrode layers disposed on different layers, and electrically coupled to the electrode layers, wherein, in each of the second subpixels, the first electrode and the second electrode of the storage capacitor are respectively disposed in layers corresponding to active layers of different transistors and are formed of transparent semiconductor materials.

14. The display device of claim 13, wherein the transparent semiconductor materials include an oxide semiconductor.

15. The display device of claim 14, wherein the connection pattern is electrically coupled to the driving voltage line.

16. The display device of claim 13, wherein the second electrode of the storage capacitor is electrically coupled to a power supply source.

17. The display device of claim 13, further comprising:

a data line configured to supply a data voltage to each of the first subpixels and the second subpixels, wherein the data line is disposed on a same layer as the driving voltage line and the connection pattern.

18. The display device of claim 13, further comprising:

a switching transistor disposed in each of the first subpixels and the second subpixels.

19. The display device of claim 18, wherein the switching transistor includes an active layer formed of a transparent semiconductor material.

20. The display device of claim 19, wherein the driving transistor further includes an active layer formed of a transparent semiconductor material.

21. The display device of claim 20, wherein the active layer of the driving transistor is disposed on a different layer from the active layer of the switching transistor.

22. The display device of claim 20, wherein, in each of the second subpixels, the first electrode of the storage capacitor is disposed on a same layer as the active layer of the driving transistor, and the second electrode of the storage capacitor is disposed on a same layer as the active layer of the switching transistor.

* * * * *